US009873773B2

(12) United States Patent
Zhang et al.

(10) Patent No.: US 9,873,773 B2
(45) Date of Patent: Jan. 23, 2018

(54) COMPOSITE MATERIAL AND METHOD FOR PREPARING THE SAME

(71) Applicant: BOE TECHNOLOGY GROUP CO., LTD., Beijing (CN)

(72) Inventors: Wei Zhang, Beijing (CN); Xiangchun Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/134,708

(22) Filed: Apr. 21, 2016

(65) Prior Publication Data
US 2016/0316590 A1 Oct. 27, 2016

(30) Foreign Application Priority Data

Apr. 23, 2015 (CN) .......................... 2015 1 0197778

(51) Int. Cl.
G21F 1/06 (2006.01)
G21F 5/00 (2006.01)
C08K 3/00 (2006.01)
C04B 35/00 (2006.01)
C08K 3/22 (2006.01)
C08K 3/24 (2006.01)
H01F 1/00 (2006.01)

(52) U.S. Cl.
CPC ................ *C08K 3/00* (2013.01); *C04B 35/00* (2013.01); *C08K 3/22* (2013.01); *C08K 3/24* (2013.01); *G21F 1/06* (2013.01); *G21F 5/00* (2013.01); *H01F 1/00* (2013.01); C08K 2003/2241 (2013.01)

(58) Field of Classification Search
CPC .... H01B 1/00; H01B 1/08; G21F 1/00; G21F 1/06; G21F 1/08; G21F 3/00; G21F 5/00
See application file for complete search history.

(56) References Cited

U.S. PATENT DOCUMENTS 4,773,938 A * 9/1988 Buxbaum ............ C01G 49/009
106/418

FOREIGN PATENT DOCUMENTS

CN 1588593 A 3/2005
CN 1807537 A 7/2006
CN 103184033 A 7/2013

OTHER PUBLICATIONS

Qiu et al "Microwave absorption properties of substituted BaFe12O19/TiO2 nanocomposite multilayer film", J Mater Sci (2007) 42:166-169.*

(Continued)

*Primary Examiner* — Mark Kopec
(74) *Attorney, Agent, or Firm* — Harness, Dickey & Pierce, P.L.C.

(57) ABSTRACT

Disclosed are a composite material and a method for preparing the same. The composite material is consisted of $TiO_2$ and $BaZn_{1.2}Co_{0.8}Fe_{16}O_{27}$. The composite material of the invention has the advantages of high absorption frequency band, good compatibility and wide frequency band, and it is applicable for the shell protection material of a mobile phone or a TV set, thereby absorbing the electromagnetic wave band that is the most harmful to human bodies, without influencing the normal communication function of an electronic device, for example, a mobile phone.

18 Claims, 3 Drawing Sheets

(56) References Cited

OTHER PUBLICATIONS

Chandra et al "Electroless Ni—P-ferrite composite coatings for microwave applications", Pramana Journal of Physics vol. 65, No. 5, Nov. 2005, pp. 959-965.*

Qui et al "Microwave absorption properties of nanocomposite films of BaFe12O19 and TiO2 prepared by sol-gel method", Materials Science and Engineering B 133 (2006) 191-194.*

English language machine translation of CN 158593A (pub Mar. 2005).*

Wang L., et al., "Microwave Performances of $(Zn_{1-x}Co_x)_2$-W Barium Ferrite by EDTA-citrate Sol-gel Process" Journal of Materials Science & Engineering vol. 24, No. 5, Oct. 2006.

Dadfar M., et al., "Sol-Gel Synthesis and Characterization of $SrFe_{12}O_{19}/TiO_2$ Nanocomposites" [online] Journal of Superconductivity and Novel Magnetism, Oct. 2, 2014.

First Office Action regarding Chinese application No. 201510197778.0, dated Mar. 17, 2016. Translation provided by Dragon Intellectual Property Law Firm.

Third Office Action regarding Chinese Application No. 201510197778.0, dated Dec. 26, 2016. Translation provided by Dragon Intellectual Property Law Firm.

Liu, J., et al., "Microwave Absorption Enhancement of Multifunctional Composite Microspheres with Spinel $Fe_3O_4$ Cores and Anatase $TiO_2$ Shells", [online] Small Journal, vol. 8, No. 8, pp. 1214-1221, (2012).

\* cited by examiner

COMPOSITE MATERIAL AND METHOD FOR PREPARING THE SAME

CROSS-REFERENCE TO RELATED APPLICATION

The present application claims priority to and incorporates by reference the entire contents of Chinese priority document 201510197778.0, filed in China on Apr. 23, 2015.

TECHNICAL FIELD

The present invention relates to a composite material and a method for preparing the same, and in particular, to a W-type Ba-Ferrite/$TiO_2$ composite material and a method for preparing the same.

BACKGROUND

In daily life, electromagnetic waves exist everywhere, for example, radio broadcast, TV set, mobile communication, radio telecontrol, navigation and high-voltage distribution line, etc., all radiate strong electromagnetic waves energy to the surroundings. Since the electronic industry made its appearance, revolutionary changes do have been made to the science and technology and the industry, and great convenience have been made to people's life; however, the electromagnetic waves radiated by various electronic products sometimes may pollute the environment, this has become one of the significant environment pollution factors, and it may endanger human health, thus it has become another public nuisance to human environment in the train of exhaust gas, waste water, waste residue and noise. Wherein, 3 MHz~30 MHz is the military short-wave band, which has little relation with the public and is thus unconcerned. Because of the popularization of devices such as mobile phone, TV set, high-voltage electricity, etc., in people's daily life, the electromagnetic wave frequency band is in the range of 30 MHz~30 GHz, wherein, the higher the frequency is, the more harmful it will be to human bodies. At present, there is little research on the reduction of radiation caused by electronic products (for example, mobile phone, TV set and the like), and the application area of high-frequency radiation products are limited, therefore, it seems necessary to develop novel wave-absorbing materials. Titanium dioxide ($TiO_2$) has a high dielectric constant and a good stability, thus it is an important dielectric material, which can absorb electromagnetic waves via dielectric loss. A composite wave-absorbing material with both good dielectric loss capability and good magnetic loss capability may be obtained by compounding $TiO_2$ and W-type Ba-Ferrite.

SUMMARY

One embodiment of the present invention relates to a composite material comprising $TiO_2$ and $BaZn_{1.2}Co_{0.8}Fe_{16}O_{27}$. In the text below, $BaZn_{1.2}Co_{0.8}Fe_{16}O_{27}$ is shorted as BaW. The composite material of the invention has the advantages of high absorption frequency band, good compatibility and wide frequency band.

The composite material of one embodiment of the invention comprises $TiO_2$ and $BaZn_{1.2}Co_{0.8}Fe_{16}O_{27}$, and specifically, it is composed of $TiO_2$-coated $BaZn_{1.2}Co_{0.8}Fe_{16}O_{27}$ particulates. Wherein, a weight ratio of $TiO_2$ to $BaZn_{1.2}Co_{0.8}Fe_{16}O_{27}$ is (0.1-10):(1-10), and optionally, (0.1-1):(5-10); for example, in one embodiment of the invention, the weight ratio is 0.469:7.94.

In one embodiment of the invention, the composite material is a powder with a micrometer-level grain size.

In one embodiment of the invention, a reflection loss of the composite material at 7.76-13.68 GHz is less than −10 dB, and a reflection loss thereof at 10.3 GHz is −47.6 dB.

The invention further provides a method for preparing a composite material, which includes the steps of:

dissolving $Ba(NO_3)_2$, $Zn(NO_3)_2 \cdot 6H_2O$, $Co(NO_3)_2 \cdot 6H_2O$ and $Fe(NO_3)_3 \cdot 9H_2O$ in distilled water at a molar ratio of 1:1.2:0.8:16, adding a citric acid at a molar ratio of 10:1 relative to $Ba(NO_3)_2$, stirring till complete dissolution, adjusting a pH value of a resultant solution to neutrality, evaporating the solution to prepare a sol, drying to obtain a gel, and then calcining the gel to obtain $BaZn_{1.2}Co_{0.8}Fe_{16}O_{27}$; and adding $BaZn_{1.2}Co_{0.8}Fe_{16}O_{27}$ into a $TiO_2$ sol, stirring and filtering, washing the obtained filter residue, drying the obtained filter residue to obtain a precursor, and drying the precursor to obtain the composite material; wherein, a weight ratio of $TiO_2$ to $BaZn_{1.2}Co_{0.8}Fe_{16}O_{27}$ is (0.1-10):(1-10), and preferably, (0.1-1):(5-10); for example, in one embodiment of the invention, the weight ratio is 0.469:7.94.

Optionally, $Ba(NO_3)_2$ is analytically pure $Ba(NO_3)_2$, $Zn(NO_3)_2 \cdot 6H_2O$ is analytically pure $Zn(NO_3)_2 \cdot 6H_2O$, $Co(NO_3)_2 \cdot 6H_2O$ is analytically pure $Co(NO_3)_2 \cdot 6H_2O$, $Fe(NO_3)_3 \cdot 9H_2O$ is analytically pure $Fe(NO_3)_3 \cdot 9H_2O$.

Optionally, the evaporation of the solution is constant-temperature evaporation in a 70° C. water bath.

Optionally, before being calcined at 1300° C., the gel is ground into powder.

Optionally, the filter residue is washed with absolute ethyl alcohol.

Optionally, the filter residue washed with absolute ethyl alcohol is dried at 80° C.

Optionally, the $TiO_2$ sol is prepared by: dissolving 2 parts by weight of butyl titanate and 1 part by weight of glacial acetic acid in 10 parts by weight of absolute ethyl alcohol, and stirring to obtain a transparent solution; and adding 4 parts by weight of an ethanol solution with a volume fraction of 75% dropwise into the transparent solution slowly, and stirring to obtain the $TiO_2$ sol.

Optionally, the calcining is performed at 1300° C.

The composite material of the invention may be used as a material for manufacturing the shell of an electronic device such as a mobile phone, etc., thereby absorbing the electromagnetic wave band that is the most harmful to human bodies, without influencing the normal communication function of an electronic device, for example, a mobile phone.

It is another object of the invention to provide an electronic device shell, which is made from a raw material that includes the composite material.

Optionally, the electronic device is a mobile phone.

In the invention, a composite material with both good dielectric loss capability and good magnetic loss capability is obtained by compounding $TiO_2$ and BaW material. The composite material of the invention has the advantages of high absorption frequency band, good compatibility and wide frequency band, and it may be used as the material of the shell of an electronic device such as a mobile phone, etc., thereby absorbing the electromagnetic wave band that is the most harmful to human bodies, without influencing the normal communication function of an electronic device, for example, a mobile phone.

BRIEF DESCRIPTION

DETAILED DESCRIPTION

Figure 1:
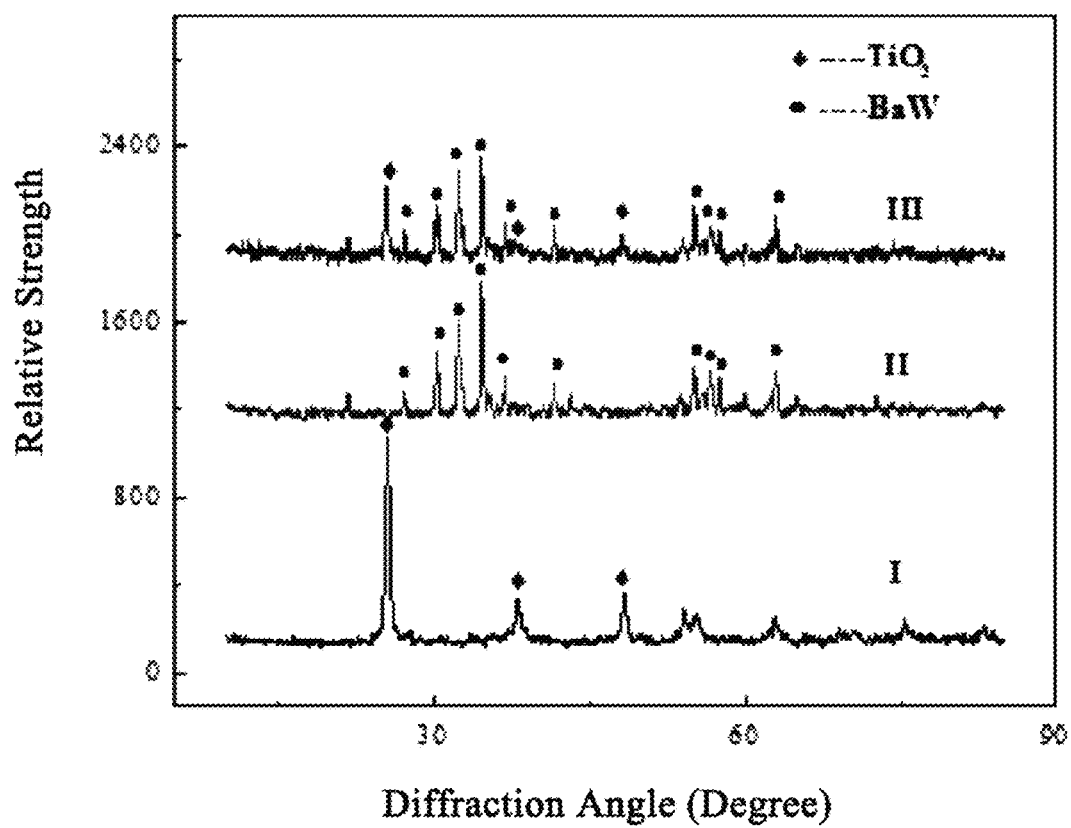
FIG. 1 shows XRD diagrams of a BaW/$TiO_2$ composite material, BaW and $TiO_2$ according to Embodiment 1.

The composite material of the embodiment of the invention comprises TiO$_2$ and BaZn$_{1.2}$Co$_{0.8}$Fe$_{16}$O$_{27}$. Optionally, the composite material is a powder with a micrometer-level grain size. Optionally, the reflection loss of the composite material at 7.76-13.68 GHz is less than −10 dB, and the reflection loss thereof at 10.3 GHz is −47.6 dB.

The composite material of the embodiment of the invention has the advantages of high absorption frequency band, good compatibility and wide frequency band, and it may be used as the material of the shell of an electronic device such as a mobile phone, etc., thereby absorbing the electromagnetic wave band that is the most harmful to human bodies, without influencing the normal communication function of an electronic device, for example, a mobile phone.

The specific implementation modes of the invention will be further described in detail below in conjunction with the drawings and embodiments. The embodiments below are used for illustrating the invention, rather than limiting the scope of the invention.

Embodiment 1

1) Preparation of BaZn$_{1.2}$Co$_{0.8}$Fe$_{16}$O$_{27}$:

First Step: 2.61 g Ba(NO$_3$)$_2$, 2.97 g Zn(NO$_3$)$_2$·6H$_2$O, 2.91 g Co(NO$_3$)$_2$·6H$_2$O and 3.42 g Fe(NO$_3$)$_3$·9H$_2$O are dissolved in 50 mL distilled water, and after sufficient dissolution, 19.5 g analytically pure citric acid is added thereto and is stirred sufficiently till complete dissolution, and then the pH of the solution is adjusted to neutrality with ethylene diamine.

Second Step: The above solution is placed in a 70° C. water bath for constant-temperature evaporation to prepare a sol, and it is dried to obtain a gel. The gel is ground to powder and calcined at 1300° C. for 3 h to obtain BaW particulates.

Third Step: 2 mg butyl titanate and 1 mg glacial acetic acid are dissolved in 10 mg absolute ethyl alcohol and stirred sufficiently to obtain a transparent solution A, and 4 mg ethanol solution with a volume fraction of 75% is added dropwise into solution A, and it is stirred for 30 min to obtain a light yellow TiO$_2$ sol. 7.94 g BaW powder is weighted out and added into the sol, and it is filtered after being stirred for 3 h at room temperature, the obtained filter residue is washed with absolute ethyl alcohol, and then the obtained filter residue is dried at 80° C. for 10 h to obtain a precursor. The precursor is dried at 500° C. for 3 h to obtain a BaW/TiO$_2$ composite material powder that is composed of TiO$_2$-coated BaZn$_{1.2}$Co$_{0.8}$Fe$_{16}$O$_{27}$ particulates, wherein the grain size of the powder is at micrometer-level (1-1000 um).

2) The structure, compositions, appearance, magnetic performance and wave-absorbing performance of the composite material BaW/TiO$_2$:

The BaW/TiO$_2$ composite material obtained in Embodiment 1 is mixed with paraffin with a mass ratio of 2.4:1, and pressed into an annular sample with an outer diameter of 7 mm, an inner diameter of 3 mm and a thickness of about 4 mm via a mould.

Figure 2:
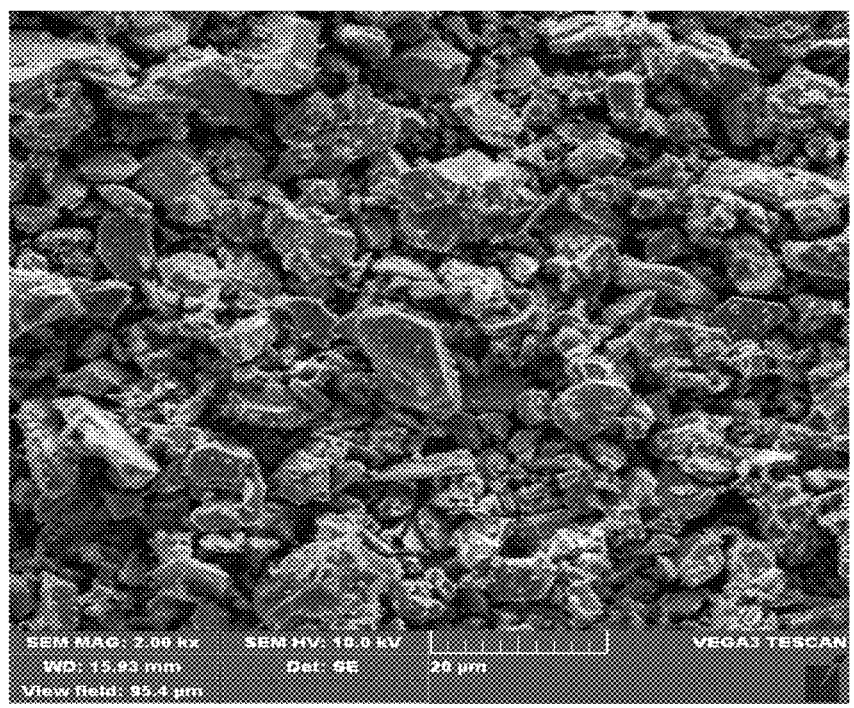
FIG. 2 shows an SEM diagram of a sample of the BaW/TiO$_2$ composite material according to Embodiment 1.

The BaW/TiO$_2$ composite material sample is observed via a scanning electron microscope, and the result is as shown in FIG. 2. The BaW/TiO$_2$ composite material is a micrometer-level wave-absorbing material.

The BaW/TiO$_2$ composite material sample is analyzed via X-ray diffraction, the result is as shown in FIG. 1, and it indicates that the composite material obtained is truly a BaW/TiO$_2$ composite material.

The electromagnetic parameters thereof, i.e., real part of magnetic permeability ($\mu'$) imaginary part of magnetic permeability ($\mu''$), real part of dielectric constant ($\epsilon'$) and imaginary part of dielectric constant ($\epsilon''$), are tested in a range of 2-18 GHz via a vector network analyzer.

The reflectivity R(dB) of the sample is finally simulated via complex magnetic permeability $\mu r=\mu'-j\mu''$, complex dielectric constant $\epsilon r=\epsilon'-j\epsilon''$ and formula $$Z_{in} = \sqrt{\frac{\mu_r}{\epsilon_r}} \tanh\left(j\frac{2\pi f d}{c}\sqrt{\mu_r \epsilon_r}\right) \text{ and}$$

$$R(\text{dB}) = 20\ lg\left|\frac{Z_{in}-1}{Z_{in}+1}\right|.$$

Figure 3:
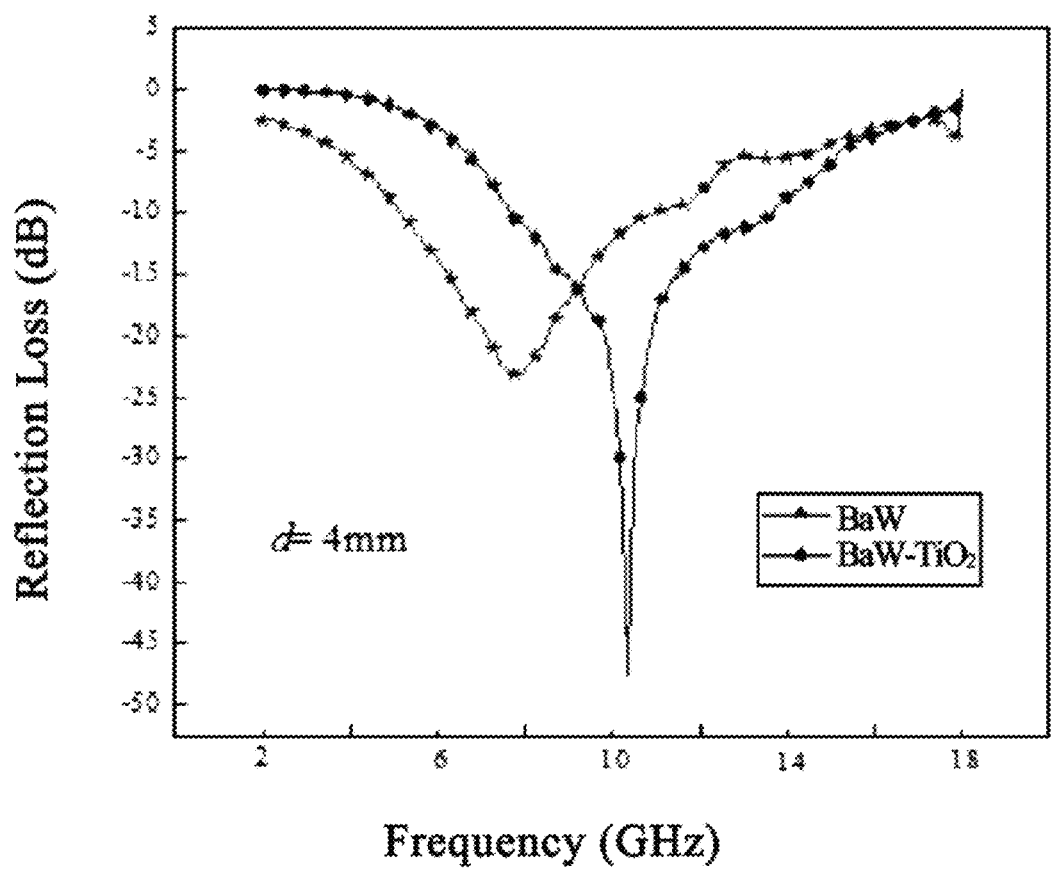
FIG. 3 shows reflection loss curves of the BaW/TiO$_2$ composite material and BaW according to Embodiment 1.

It is measured that the reflection loss of the BaW/TiO$_2$ composite material sample at 7.76-13.68 GHz is less than −10 dB, and the reflection loss thereof at 10.3 GHz is −47.6 dB (as shown in FIG. 3). The bandwidth of the BaW/TiO$_2$ composite material sample at which the electromagnetic wave reflectivity is less than −10 dB may reach 3.92 GHz and the minimum reflectivity is −47.6 dB, which indicates that the BaW/TiO$_2$ composite material has the advantages of high absorption frequency band, good compatibility and wide frequency band.

The above description only shows some preferred embodiments of the invention. It should be noted that, various improvements and substitutions may also be made by one of ordinary skills in the art without departing from the technical principles of the invention, and all these improvements and substitutions should be regarded as falling into the protection scope of the invention.

What is claimed is:

1. A composite material, comprising TiO$_2$-coated BaZn$_{1.2}$Co$_{0.8}$Fe$_{16}$O$_{27}$ particulates.

2. The composite material according to claim 1, wherein, a weight ratio of TiO$_2$ to BaZn$_{1.2}$Co$_{0.8}$Fe$_{16}$O$_{27}$ is (0.1-10):(1-10).

3. The composite material according to claim 1, wherein, the composite material is a powder with a micrometer-level grain size.

4. The composite material according to claim 1, wherein, a reflection loss of the composite material at 7.76-13.68 GHz is less than −10 dB, and a reflection loss thereof at 10.3 GHz is −47.6 dB.

5. An electronic device shell, which is made from a raw material comprising the composite material according to claim 1.

6. The electronic device shell according to claim 5, wherein, the weight ratio of TiO$_2$ to BaZn$_{1.2}$Co$_{0.8}$Fe$_{16}$O$_{27}$ is (0.1-10):(1-10).

7. The electronic device shell according to claim 5, wherein, the composite material is a powder with a micrometer-level grain size.

8. The electronic device shell according to claim 5, wherein, the reflection loss of the composite material at 7.76-13.68 GHz is less than −10 dB, and the reflection loss thereof at 10.3 GHz is -47.6 dB.

9. The electronic device shell according to claim 5, wherein, the electronic device is a mobile phone.

10. A method for preparing a composite material, comprising the steps of:

dissolving $Ba(NO_3)_2$, $Zn(NO_3)_2 \cdot 6H_2O$, $Co(NO_3)_2 \cdot 6H_2O$ and $Fe(NO_3)_3 \cdot 9H_2O$ in distilled water at a molar ratio of 1:1.2:0.8:16, adding a citric acid at a molar ratio of 10:1 relative to $Ba(NO_3)_2$, stirring till complete dissolution, adjusting a pH value of a resultant solution to neutrality, evaporating the solution to prepare a sol, drying to obtain a gel, and then calcining the gel to obtain $BaZn_{1.2}Co_{0.8}Fe_{16}O_{27}$; and adding $BaZn_{1.2}Co_{0.8}Fe_{16}O_{27}$ into a $TiO_2$ sol, stirring and filtering, washing the obtained filter residue, drying the obtained filter residue to obtain a precursor, and drying the precursor to obtain the composite material which comprises $TiO_2$-coated $BaZn_{1.2}Co_{0.8}Fe_{16}O_{27}$ particulates.

11. The method according to claim 10, wherein, $Ba(NO_3)_2$ is analytically pure $Ba(NO_3)_2$, $Zn(NO_3)_2 \cdot 6H_2O$ is analytically pure $Zn(NO_3)_2 \cdot 6H_2O$, $Co(NO_3)_2 \cdot 6H_2O$ is analytically pure $Co(NO_3)_2 \cdot 6H_2O$, $Fe(NO_3)_3 \cdot 9H_2O$ is analytically pure $Fe(NO_3)_3 \cdot 9H_2O$.

12. The method according to claim 10, wherein, the evaporation is constant-temperature evaporation in 70° C. water bath.

13. The method according to claim 10, wherein, before being calcined at 1300° C., the gel is ground into powder.

14. The method according to claim 10, wherein, the filter residue is washed with absolute ethyl alcohol.

15. The method according to claim 14, wherein, the filter residue washed with absolute ethyl alcohol is dried at 80° C.

16. The method according to claim 10, wherein, the $TiO_2$ sol is prepared by: dissolving 2 parts by weight of butyl titanate and 1 part by weight of glacial acetic acid in 10 parts by weight of absolute ethyl alcohol, and stirring to obtain a transparent solution; and adding 4 parts by weight of an ethanol solution with a volume fraction of 75% dropwise into the transparent solution slowly, and stirring to obtain the $TiO_2$ sol.

17. The method according to claim 10, wherein, the calcining is performed at 1300° C.

18. The method according to claim 10, wherein, a weight ratio of $TiO_2$ to $BaZn_{1.2}Co_{0.8}Fe_{16}O_{27}$ is (0.1-10):(1-10).

* * * * *